United States Patent [19]

Horn et al.

[11] Patent Number: 5,525,162
[45] Date of Patent: Jun. 11, 1996

[54] THERMAL CONDUCTIVITY ENHANCEMENT TECHNIQUE

[75] Inventors: Stuart B. Horn, Fairfax; Elizabeth H. Nelson, Sprigfield, both of Va.

[73] Assignee: The United States of America as represented by the Secretary of The Army, Washington, D.C.

[21] Appl. No.: 494,750

[22] Filed: Jun. 26, 1995

[51] Int. Cl.⁶ .................................................. H01L 35/34
[52] U.S. Cl. ..................... 136/201; 136/200; 136/236.1; 136/238; 136/240
[58] Field of Search ................................. 136/200, 201, 136/203, 205, 224, 225, 236.1, 238, 240; 423/87, 88, 508, 509; 252/62.3 T; 75/351, 362

[56] References Cited

U.S. PATENT DOCUMENTS

| | | | |
|---|---|---|---|
| 3,018,312 | 1/1962 | Cornish et al. | 136/5 |
| 3,023,079 | 2/1962 | Kulifay | 23/50 |
| 3,023,080 | 2/1962 | Kulifay | 23/50 |
| 3,023,081 | 2/1962 | Kulifay | 23/50 |
| 3,026,175 | 3/1962 | Kulifay | 23/50 |
| 3,058,802 | 10/1962 | Kulifay | 23/50 |
| 3,306,701 | 2/1967 | Anderson et al. | 23/50 |
| 3,524,771 | 8/1970 | Green | 136/203 |
| 4,484,945 | 11/1984 | Badesha et al. | 75/0.5 A |
| 4,557,922 | 12/1985 | Badesha et al. | 423/510 |
| 4,576,634 | 3/1986 | Badesha et al. | 75/0.5 A |
| 4,626,612 | 12/1986 | Brotz | 136/224 |
| 4,717,788 | 1/1988 | Rauch, Sr. et al. | 136/237 |
| 4,717,789 | 1/1988 | Rauch, Sr. et al. | 136/238 |
| 4,863,508 | 9/1989 | Badesha et al. | 75/0.5 A |
| 5,006,505 | 4/1991 | Skertic | 505/1 |
| 5,168,339 | 12/1992 | Yokotani et al. | 257/64 |
| 5,306,555 | 4/1994 | Ramamurthi et al. | 428/289 |
| 5,443,746 | 8/1995 | Harris et al. | 252/62.9 |

*Primary Examiner*—Donald P. Walsh
*Assistant Examiner*—Chrisman D. Carroll
*Attorney, Agent, or Firm*—Milton W. Lee; Alain L. Bashore; Anthony T. Lane

[57] ABSTRACT

A technique for forming from staring precursors at the molecular level, a resultant thermoelectric material with a reduced thermal conductivity. All staring precursors are dissolved in solution, reduced to remove oxygen, and then combined into a single solution to yield specific stoichiometric ratios. A sol and then a gel is formed, which supercritical solvent extraction is performed upon so as to yield a material having two level porosity and a maximum of a factor of three reduction in thermal conductivity.

4 Claims, 3 Drawing Sheets

THERMAL CONDUCTIVITY ENHANCEMENT TECHNIQUE

DESCRIPTION

CROSS-REFERENCE TO RELATED APPLICATIONS

This application is related to U.S. patent application 226,572 filed 12 Apr. 1994, now abandoned.

BACKGROUND OF THE INVENTION

1. Field of the Invention

The present invention generally relates to semiconductor thermoelectric materials and more specifically, to a formation technique which results in the decrease of the thermal conductivity of a semiconductor thermoelectric material.

2. Description of Prior Art

The basic component of the modern thermoelectric device utilizes semiconductors in what is called the Peltier Couple. The Peltier Couple essentially consists of metallic conductors (which ideally exhibit negligible thermoelectric effects) which are coupled through a doped n-type and p-type semiconductor. The nature of the semiconductors allow for a larger energy to be released or required due to changes in transport energy as electrons move between metal to semiconductor and back again. The usefulness of a particular material resides for the most part on three material properties: Seebeck coefficient S, electrical resistivity ρ, and thermal conductivity k.

The usefulness of any thermoelectric material can be described by a figure-of-merit (Z) expressed as:

$$Z = \alpha^2 \sigma / K$$

where α is the Seebeck coefficient, σ is the electrical conductivity, and K is the total thermal conductivity, a sum of lattice and electronic components. No viable device has yet been developed utilizing thermoelectric semiconductor elements since there awaits in the prior art the development of thermoelectric materials with higher figure-of-merits (FOMs) than are presently available.

It is thus desirable from a mathematical analysis to increase the numerator and decrease the denominator of the above equation, thereby increasing Z.

While the prior art has reported using semiconductor thermoelectric materials none have established a basis for a specific material that is dedicated to the task of resolving the particular problem at hand. What is needed in this instance is a formation technique which results in the decrease of the thermal conductivity of a semiconductor thermoelectric material.

SUMMARY OF THE INVENTION

It is therefore one object of the invention to provide a formation technique which results in the decrease of the thermal conductivity of a semiconductor thermoelectric material.

According to the invention, there is disclosed a technique for forming from starting precursors, a resultant thermoelectric material with a reduced thermal conductivity. Starting precursors, which may include optional dopants and/or optional second phases, are individually dissolved into separate solutions common to all components. The precursor solutions are chemically reacted (reduced) to remove oxygen and are then combined into a single solution to yield specific stoichiometric ratios. This synthesis allows for mixing precursors and dopants at the molecular level while reducing or precluding the formation of oxygen. The presence of oxygen in the final solution will inhibit the electrical conductivity in the final material. In order to improve the thermoelectric material, either thermal conductivity must be lowered or thermoelectric power or electrical conductivity must increased.

A sol (colloidal suspension of solid particles in a liquid) is formed, and then a gel (a substance that contains a continuous solid skeleton enclosing a continuous liquid phase) is created. After formation, the gel is supercritically (hypercritically) dried using an autoclave and/or Poloron method. When the temperature and pressure in the autoclave vessel are increased above the known critical threshold of the liquid, it is transformed into a supercritical fluid in which every molecule can move freely and surface tensions cease. Without surface tension, menisci do not form. The fluid is then slowly released from the autoclave leaving a gel body behind. As an alternative, the pore liquid may be exchanged for a liquid carbon dioxide, a substance with a much lower critical point (Poloron technique).

The formed material body formed as small grain or particle materials all formed into a delicate skeleton network consisting of chains and branches resulting in a two level porosity. The use of appropriate optional second phases will induce greater scattering, with the subsequent removal of such second phases resulting in an even greater scattering effect.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The underlying theory utilized in the present invention pertains to thermal conductivity of metallic crystals. The thermal conductivity of a crystal is given by the following equation:

$$\lambda = \lambda_s - 2/3\, \lambda_o \sqrt{l/3L}$$

where:

$\lambda_o$ is the ideal thermal conductivity of a large crystal of the solid solution given by $\lambda_o = C\, v^2\, A_{82} / W_D^2$ $\lambda_S$=actual thermal conductivity in absence of boundary scattering C=total specific heat per volume $A_\mu$=constant $W_D$=phonon frequency at which point defects take over v=speed of sound l=mean free path L=grain size.

Then the reduction in thermal conductivity of the crystal is given by:

$$\lambda_s - \lambda = 2/3\, \lambda_o \sqrt{1/3L}$$

so that to reduce the thermal conductivity by boundary scattering, grains (L) must therefore be small. Using values for BiSb (as an example only) we find that:

$$\lambda = 2.6 - 6.53 \sqrt{.523 \times 10^3 / L} \quad \text{W/mK}$$

and with a grain size L=0.13 μm there results:

$\lambda$=1.3 W/mK or 50% of the normal value.

So in the above example of 0.13 um (or 130 nm grain size) for BiSb, the resultant structure showed a 50% reduction in thermal conductivity. The above theory will fail if the combined effects of boundary scattering and point defect scattering are so strong that the umklapp region disappears or roughly when the thermal conductivity is reduced to ⅓ of its value. Therefore, the technique of the present invention will result in a maximum of a factor of 3 in reduction of thermal conductivity.

Figure 1:
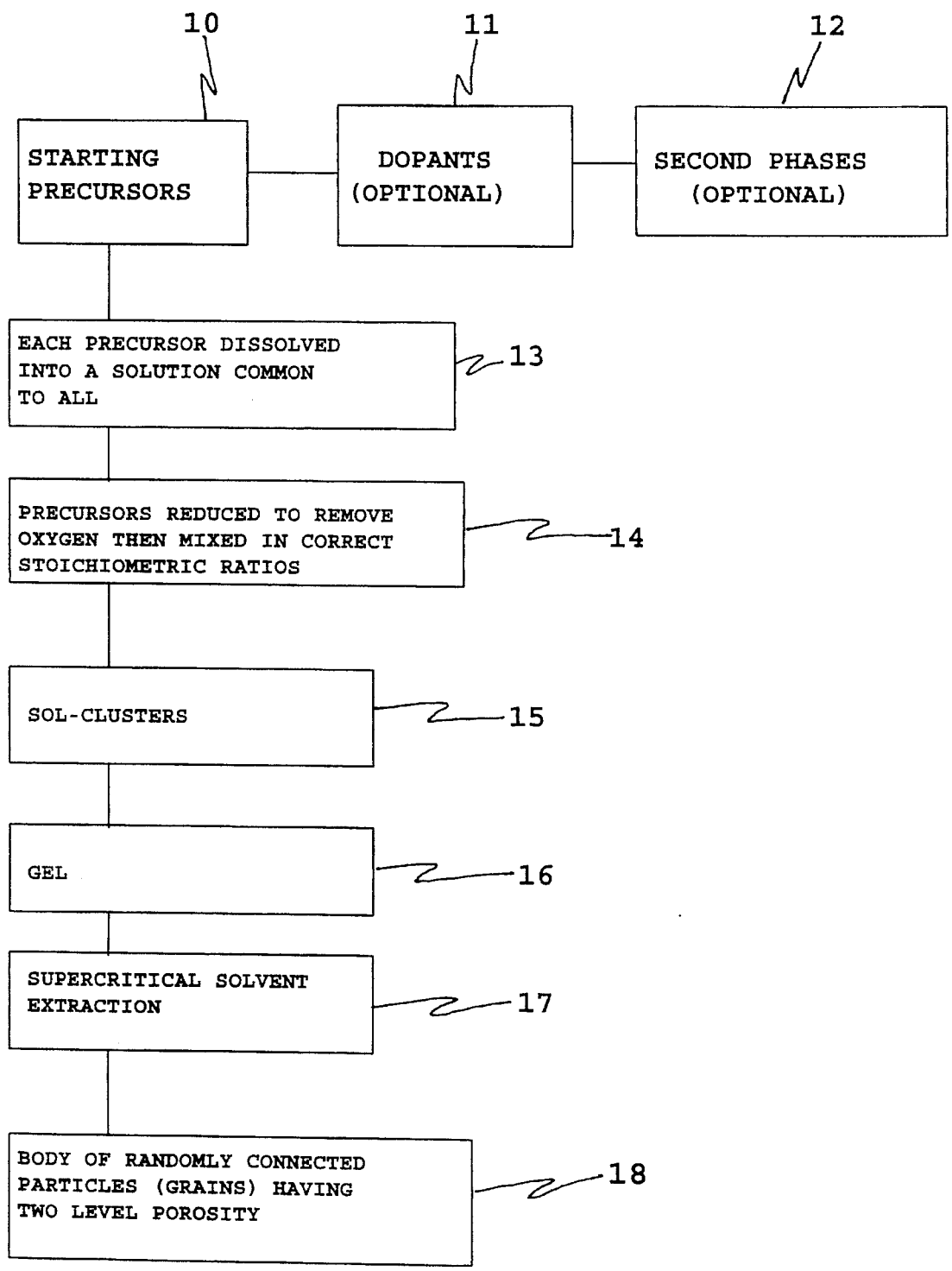
FIG. 1 a block diagram of the overall fabrication technique of the invention.

Referring now to the drawings, and more particularly to FIG. 1, there is shown in block diagram the steps of the preferred embodiment for the fabrication technique of the present invention. To have an effective thermoelectric material, the material must have a high electrical conductivity as well as a low thermal conductivity. As oxygen prohibits electrical conductivity, it must be removed from the precursor materials as part of the technique of the present invention. The thermoelectric element is grown so as to provide a lattice thermal conductivity reduced several orders of magnitude with only a small rise in electrical resistivity.

Starting precursors 10, which may include optional dopants 11 and/or optional second phases 12, are individually dissolved 13 into separate solutions common to all components). Precursor solutions are chemically reacted (reduced) 14 to remove oxygen and are then combined 15 into a single solution to yield specific stoichiometric ratios. This synthesis allows for mixing precursors and dopants at the molecular level while reducing or precluding the formation of oxygen. The presence of oxygen in the final solution will inhibit the electrical conductivity in the final material. In order to improve thermoelectric material, either thermal conductivity must be lowered or thermoelectric power or electrical conductivity must increased. From this solution, a sol (colloidal gel 16 (a substance that contains a continuous solid skeleton enclosing a continuous liquid phase) is created. After formation, the gel is supercritically (hypercritically) dried 17 using an autoclave and/or Poloron method. When the temperature and pressure in the autoclave vessel are increased above the known critical threshold of the liquid, it is transformed into a supercritical fluid in which every molecule can move freely and surface tensions cease. Without surface tension, menisci do not form. The fluid is then slowly released from the autoclave leaving a gel body behind 18. As an alternative, the pore liquid may be exchanged for a liquid carbon dioxide, a substance with a much lower critical point (Poloron technique).

In the preferred embodiment, Bismuth and tellurium are the growth elements utilized. It should be noted that this process is not limited to any particular thermoelectric material. A metallo-organic compound of Bismuth is synthesized using a double decomposition from ammonium soap. The method involves preparation of the ammonium soap of 2-ethylhexanoic acid or neodecanoic acid, then mixing the soap with a metal salt (such as chloride or nitrate) in an aqueous solution. The resulting metal soap can be separated by filtration if it is a solid, or can be extracted in solvents such as xylene, toluene, benzene etc . . . if it is a liquid. The tellurium is dissolved in a low molecular weight amine solution (later removing the amine). After reduction to remove oxygen by chemical reduction, these two solutions may be reacted together to give a solution of a specific stoichiometry.

Materials such as Tellurium and Tellurium compounds may be dissolved in a number of low molecular weight amines such as n-propylamine, n-butylamine, n-pentylamine, etc. Once into solution, the tellurium can be mixed with Bismuth solution in a solvent common to both in the required stoichiometric ratios and at the molecular level. This solution may be processed for a sol-gel mixture of BiTe. Oxygen is then removed from this material by standard chemical reduction. From this solution, the gel is thus created. After formation, the gel is supercritically (hypercritically) dried using an autoclave and/or Poloron method. When the temperature and pressure in the autoclave vessel are increased above a critical threshold of approximately 80 bars at a temperature of 270 degrees Celsius the liquid is transformed into a supercritical fluid in which every molecule can move freely and surface tensions cease. Without surface tension, menisci do not form. The fluid is then slowly released from the autoclave leaving a gel body as the resultant structure.

Figure 2:
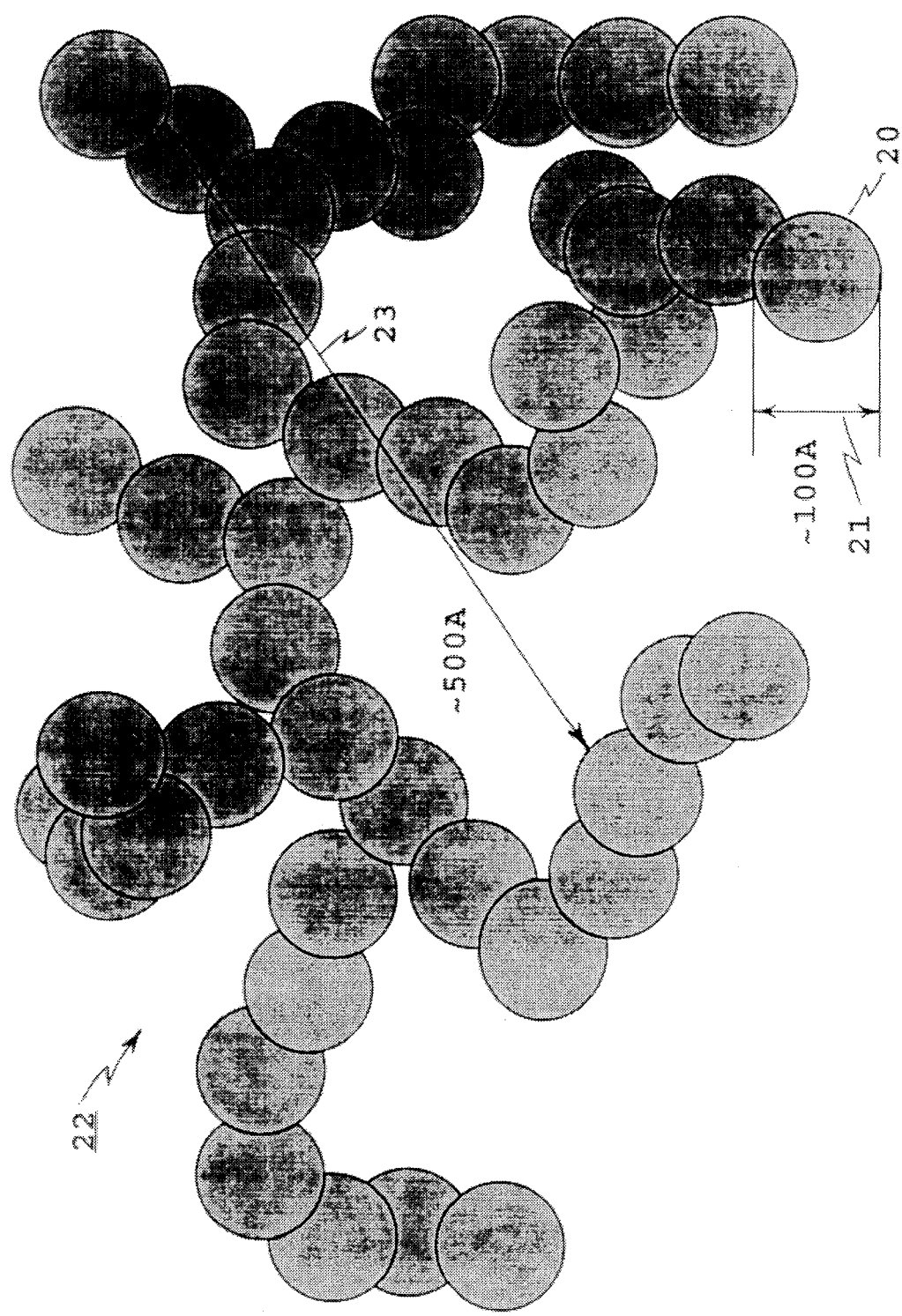
FIG. 2 is a schematic diagram of the resultant structure of the invention.

FIG. 2 is a schematic diagram of the resultant structure of the invention which is described as having a "two level porosity" There is formed small grain or particle materials 20 with average diameter 21 as shown (with a characteristic porosity), all formed into a delicate skeleton network 22 consisting of chains and branches with average distances 23 between branches (with another type of characteristic porosity). There results in a two level porosity in sizes of 2 to 50 nanometers for the structure shown in FIG. 2. The use of appropriate optional second phases will induce greater scattering, with the subsequent removal of such second phases resulting in an even greater scattering effect.

Figure 3:
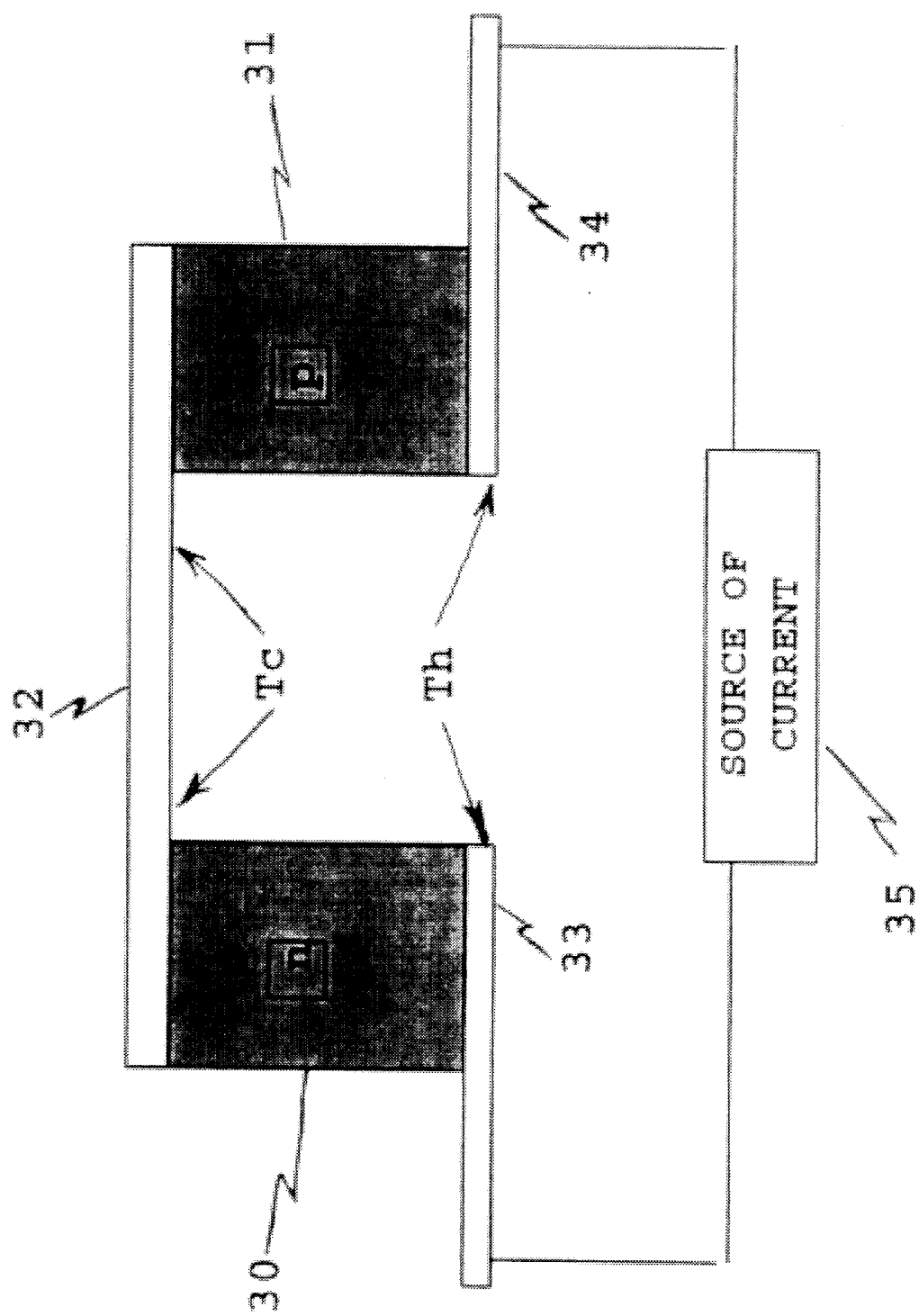
FIG. 3 is a schematic diagram of a peltier couple utilizing the resultant thermoelectric material of the present invention.

FIG. 3 is a schematic diagram of a peltier couple utilizing the thermoelectric material where n leg 30 and p leg 31 represent n-type and p-type semiconductor structures, respectively. Legs 30 and 31 are connected by metallic conductors which exhibit negligible thermoelectric effects. Conductor 32 is coupled to one side each of legs 30 and 31. Conductors 33 and 34 are coupled to the other side respectively of each leg 30 and 31. Current source 35 is coupled to each of conductors 33 and 34. In the operation as a cooler, a current is passed from leg 30 to non-thermoelectric conductor 32 removing heat from conductor 32 at a temperature To. When operated as a heater, current is passed from leg 31 to conductors 33 and 34 at a temperature $T_h$. In both cases reversing the current will cause the heat to flow the other way.

While this invention has been described in terms of the preferred embodiment consisting of specific thermoelectric devices, those skilled in the art will recognize that the invention can be practiced with modification within the spirit and scope of the appended claims.

Having thus described my invention, what We claim as new and desire to secure by Letters Patent is as follows:

1. A technique for forming from thermoelectric precursors materials, a resultant thermoelectric material with a reduced thermal conductivity comprising:

individually dissolving into separate solutions all thermoelectric precursors materials;

reacting all solutions to remove oxygen;

combining all solutions into a single solution to yield specific stoichiometric ratios;

forming a sol of the single solution;

forming a gel of the sol;

performing supercritical solvent extraction of the sol so as to yield a material having two level porosity and a maximum of a factor of three reduction in thermal conductivity.

2. The technique of claim 1 wherein the starting precursors includes dopants.

3. The technique of claim 1 wherein the staring precursors include a second phase to provide nanoinclusions to induce greater phonon scattering.

4. The technique of claim 3 wherein the nanoinclusions are subsequently removed resulting in further voids to induce greater phonon scattering.

\* \* \* \* \*